US012765393B2

(12) United States Patent
Jhang et al.

(10) Patent No.: US 12,765,393 B2
(45) Date of Patent: Oct. 13, 2026

(54) MANUFACTURING METHOD OF HEAT DISSIPATION LAYER AND MANUFACTURING METHOD OF SEMICONDUCTOR DEVICE

(71) Applicant: Taiwan Semiconductor Manufacturing Company, Ltd., Hsinchu (TW)

(72) Inventors: Jin-Hao Jhang, Hsinchu (TW); Yu-Hsiang Yen, Hsinchu (TW); Wei-Yen Woon, Taoyuan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 373 days.

(21) Appl. No.: 18/403,727

(22) Filed: Jan. 4, 2024

(65) Prior Publication Data

US 2025/0201582 A1 Jun. 19, 2025

Related U.S. Application Data

(60) Provisional application No. 63/611,205, filed on Dec. 17, 2023.

(51) Int. Cl.
*H10W 70/02* (2026.01)
*H10W 72/00* (2026.01)

(52) U.S. Cl.
CPC .......... *H10W 70/02* (2026.01); *H10W 72/073* (2026.01)

(58) Field of Classification Search
None
See application file for complete search history.

(56) References Cited

U.S. PATENT DOCUMENTS 5,925,413 A * 7/1999 Holzer ................ C23C 16/0227 427/249.12
8,993,380 B2 3/2015 Hou et al.
9,281,254 B2 3/2016 Yu et al.
9,299,649 B2 3/2016 Chiu et al.
9,372,206 B2 6/2016 Wu et al.
9,425,126 B2 8/2016 Kuo et al.
9,443,783 B2 9/2016 Lin et al.
9,461,018 B1 10/2016 Tsai et al.
9,496,189 B2 11/2016 Yu et al.
9,666,502 B2 5/2017 Chen et al.
9,735,131 B2 8/2017 Su et al.
2007/0269604 A1* 11/2007 Francis ................. H10W 70/02 257/E21.128
2008/0145974 A1* 6/2008 Freitag ................. G11B 5/3106
2015/0102469 A1* 4/2015 Colinge .............. H10P 14/3466 438/486
2021/0407882 A1* 12/2021 Chun .................. H10W 40/228

* cited by examiner

*Primary Examiner* — Nduka E Ojeh
(74) *Attorney, Agent, or Firm* — JCIPRNET

(57) ABSTRACT

A manufacturing method of a heat dissipation layer is provided. A first carrier substrate and a second carrier substrate creating a first confined space therebetween are provided. A first seed layer is formed on the first carrier substrate and a second seed layer is formed on the second carrier substrate. A first heat dissipation layer is formed from the first seed layer and the second seed layer in the first confined space. The second carrier substrate is removed from the first heat dissipation layer.

20 Claims, 17 Drawing Sheets

MANUFACTURING METHOD OF HEAT DISSIPATION LAYER AND MANUFACTURING METHOD OF SEMICONDUCTOR DEVICE

CROSS-REFERENCE TO RELATED APPLICATION

This application claims the priority benefit of U.S. provisional application Ser. No. 63/611,205, filed on Dec. 17, 2023. The entirety of the above-mentioned patent application is hereby incorporated by reference herein and made a part of this specification.

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
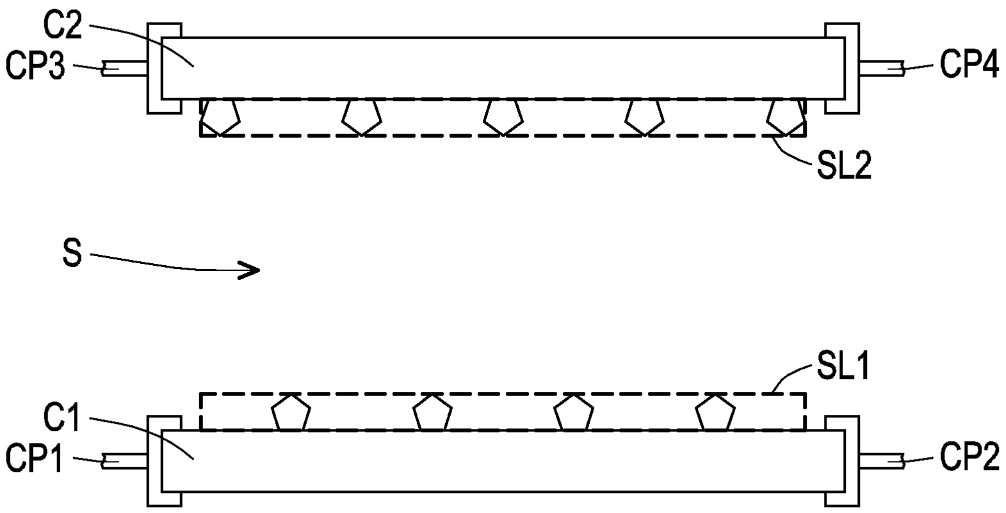
FIG. 1A to FIG. 1C are schematic cross-sectional views illustrating a manufacturing process of a heat dissipation layer in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
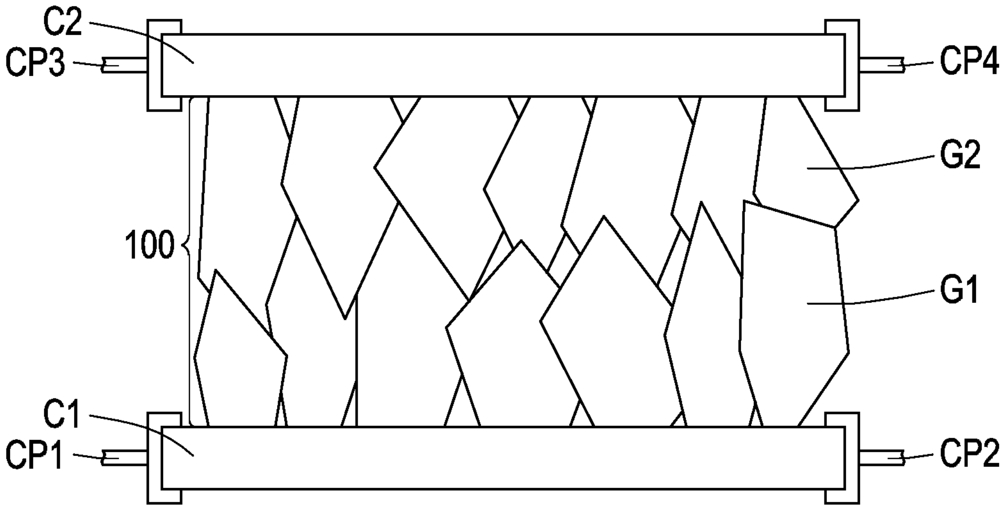
Figure 1C:
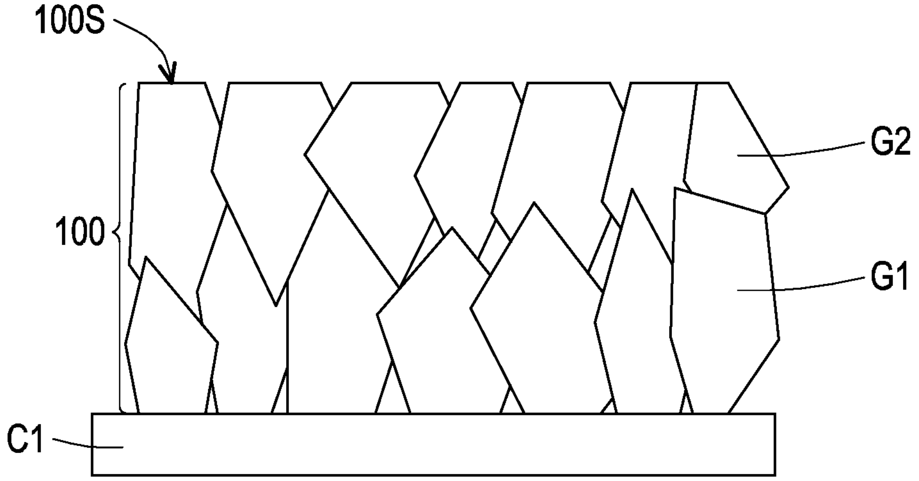

FIG. 1A to FIG. 1C are schematic cross-sectional views illustrating a manufacturing process of a heat dissipation layer in accordance with some embodiments of the disclosure. Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

Referring to FIG. 1A, two carrier substrates C1 and C2 creating a confined space S are provided. In detail, as shown in FIG. 1A, the carrier substrate C2 is stacked over the carrier substrate C1. From another point of view, the carrier substrate C1 and the carrier substrate C2 are spaced apart from each other along a direction parallel to a stacking direction of the carrier substrate C1 and the carrier substrate C2. The carrier substrate C1 is secured in clamps CP1 and CP2 and the carrier substrate C2 is secured in clamps CP3 and CP4, so that the confined space S are formed between the two carrier substrates C1 and C2. In detail, as shown in FIG. 1A, the clamps CP1 and CP2 attach to side walls of the carrier substrate C1, and the clamps CP3 and CP4 attach to side walls of the carrier substrate C2.

In some embodiments, each of the two carrier substrates C1 and C2 is made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. Each of the two carrier substrates C1 and C2 may be a bulk silicon substrate, a silicon-on-insulator (SOI) substrate, a germanium-on-insulator (GOI) substrate, or the like.

Continue referring to FIG. 1A, a seed layer SL1 is formed on the carrier substrate C1, and a seed layer SL2 is formed on the carrier substrate C2. In detail, the seed layer SL1 is formed on a surface of the carrier substrate C1 facing toward the carrier substrate C2, and the seed layer SL2 is formed on a surface of the carrier substrate C2 facing toward the carrier substrate C1. In some embodiments, each of the seed layers SL1 and SL2 includes a high kappa material. In some embodiments, the high kappa material of each of the seed layers SL1 and SL2 has a kappa value equal to or larger than about 100 W/m·k. In some embodiments, the material of each of the seed layers SL1 and SL2 includes carbide material, such as diamond, diamond like carbon (DLC), graphene, or SiC; nitride material, such as AlN or BN; or metal oxide material, such as $Y_2O_3$, yttrium aluminum garnet (YAG), $Al_2O_3$, or BeO. In some embodiments, each of the seed layers SL1 and SL2 is formed by suitable fabrication techniques, such as bias enhanced nucleation, abrasion-assisted nucleation, direct nucleation, or the like.

Referring to FIG. 1B, a heat dissipation layer 100 is formed in the confined space S between the two carrier substrates C1 and C2. In detail, as shown in FIG. 1A and FIG. 1B, the heat dissipation layer 100 is grown from the seed layers SL1 and SL2. As such, the heat dissipation layer 100 inherent the same materials as the seed layers SL1 and SL2. That is, in some embodiments, the material of the heat dissipation layer 100 includes carbide material, such as diamond, DLC, graphene, or SiC; nitride material, such as AlN or BN; or metal oxide material, such as $Y_2O_3$, YAG, $Al_2O_3$, or BeO. As mentioned above, the material of each of the seed layers SL1 and SL2 has the kappa value equal to or larger than about 100 W/m·k, and thus the heat dissipation layer 100 has high thermal conductivity.

In some embodiments, the heat dissipation layer 100 is grown from the seed layers SL1 and SL2 through a suitable deposition process such as chemical vapor deposition (CVD) (e.g., microwave plasma CVD (MPCVD), plasma-enhanced CVD (PECVD), hot filament); physical vapor deposition (PVD) (e.g., sputtering, e-beam evaporation); or atomic layer deposition (ALD) (e.g., plasma-enhanced ALD (PEALD), thermal ALD). In some embodiments, the process temperature for growing the heat dissipation layer 100 is above 300° C. and up to around 2000° C.

In some embodiments, the heat dissipation layer 100 is formed as a crystalline material layer having crystals (grains). In one embodiment, the heat dissipation layer 100 is formed as a polycrystalline material layer with nano-sized grains (nano grains). In the polycrystalline morphology, grain boundaries appear where grains with different crystalline orientations face each other, and the grain boundaries expand across the structure of the material layer. As shown in FIG. 1B, the heat dissipation layer 100 is a grained material layer formed with grains G1 grown from the seed layer SL1 and grains G2 grown from the seed layer SL2. From another point of view, since the heat dissipation layer 100 is grown from two seed layers (i.e., the seed layers SL1 and SL2) spaced from each other, there are voids in the heat dissipation layer 100. As shown in FIG. 1B, the voids are formed between the grains G1 and G2. Even there are voids in the heat dissipation layer 100, by selecting the high kappa material having the kappa value equal to or larger than about 100 W/m·k as the material of the heat dissipation layer 100, the heat dissipation layer 100 still functions great heat dissipation. However, the disclosure is not limited thereto. In some alternatively embodiments, the heat dissipation layer 100 is formed as an amorphous material layer. In embodiments where the heat dissipation layer 100 has a crystalline structure, its crystal lattice may be cubic, hexagonal, tetragonal, orthorhombic, monoclinic, triclinic, combinations thereof, or the like. In some embodiments, a thickness of the heat dissipation layer 100 ranges from about 1 m to about 5 m.

Referring to FIG. 1C, after the heat dissipation layer 100 is formed, one of the two carrier substrates C1 and C2 is removed. Although FIG. 1C illustrated that the carrier substrate C2 is removed, while the carrier substrate C1 is remained, the disclosure is not limited thereto. In some alternative embodiments, the carrier substrate C1 is removed, while the carrier substrate C2 is remained. In some embodiments, the removal of the carrier substrate C1 or C2 is performed by a mechanical grinding process, a chemical mechanical polishing (CMP) process, an etching process (e.g., dry etching process or wet etching process), or the like.

Continue referring to FIG. 1C, after the carrier substrate C2 is removed, a surface 100S of the heat dissipation layer 100 is exposed. Since the heat dissipation layer 100 is grown from the seed layers SL1 and SL2 respectively formed on the surfaces of the two carrier substrates C1 and C2, the exposed surface 100S is substantially flat. In some embodiments, the surface roughness of the surface 100S of the heat dissipation layer 100 is less than about 1 nm. As such, the heat dissipation layer 100 provides a substantially flat surface for a layer attached onto the heat dissipation layer 100 formed in the subsequent step. It is noted that, by growing the heat dissipation layer 100 made of the high kappa material in the confined space S between the two carrier substrates C1 and C2, the heat dissipation layer 100 can be formed with substantially flat surfaces without performing a planarization on the high kappa material (which leads to extreme challenges). As such, the manufacturing challenges of the manufacturing process of the heat dissipation layer 100 can be reduced. From another point of view, after the carrier substrate C2 is removed, the grain boundaries and the voids of the heat dissipation layer 100 are also exposed.

FIG. 2A to FIG. 2D are schematic cross-sectional views illustrating intermediate stages of a manufacturing process of a semiconductor device in accordance with some embodiments of the disclosure. Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

Figure 2A:
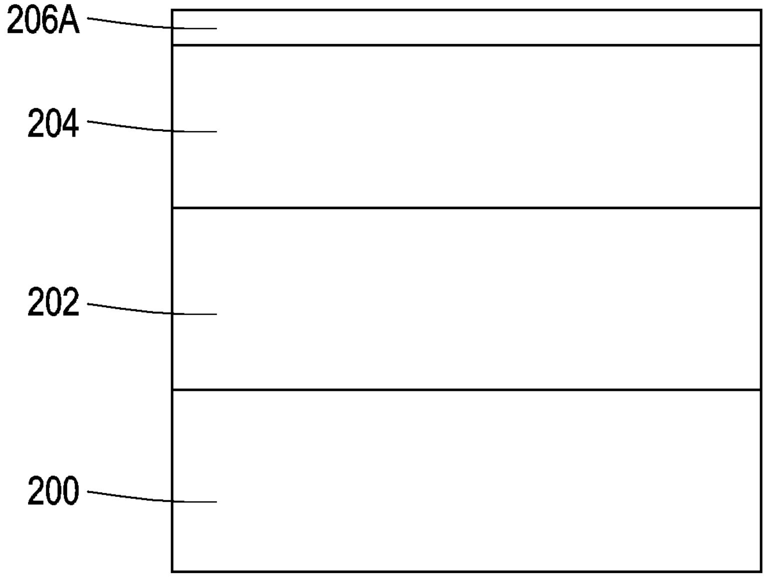
FIG. 2A to FIG. 2E are schematic cross-sectional views illustrating intermediate stages of a manufacturing process of a semiconductor device in accordance with some embodiments of the disclosure.

Referring to FIG. 2A, a device layer 202 is formed over a substrate 200. In some embodiments, the substrate 200 is made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. Further, the substrate 200 may include an epitaxial layer (epi-layer), which may be strained for performance enhancement, and/or may include a SOI structure.

In some embodiments, the device layer 202 includes active components, passive components or a combination thereof. The active components include transistors and/or diodes, for example. In some embodiments, the transistor may be p-type field-effect transistor (PFET), n-type FET (NFET), multi-gate FET, MOSFET, complementary metal-oxide semiconductor (CMOS) transistor, bipolar transistor, high voltage transistor, high frequency transistor or a combination thereof. In some embodiments, the transistor may be planar FET, FinFET, gate-all-around FET (GAA FET), complementary FET (CFET), or a combination thereof. The passive components include resistors, capacitors and/or inductors, for example.

Continue referring to FIG. 2A, an interconnect structure 204 is formed on the device layer 202. The interconnect structure 204 may be referred to as a front-side interconnect structure because it is formed on a front-side of the device layer 202 (e.g., a side of the device layer 202 on which active components are formed). In some embodiments, the interconnect structure 204 includes a plurality of dielectric layers and a plurality of conductive layers stacked alternately. In certain embodiments, the conductive layers are sandwiched between the dielectric layers, but the lowest layer of the conductive layers is exposed by the lowest layer of the dielectric layers for further electrical connection, and the topmost layer of the conductive layers is exposed by the topmost layer of the dielectric layers for further electrical connection. For example, the lowest layer of the conductive layers is exposed by the lowest layer of the dielectric layers to electrically connect the device layer 202, and the topmost layer of the conductive layers is exposed by the topmost layer of the dielectric layers to electrically connect external components.

In some embodiments, each dielectric layer of the interconnect structure 204 may be formed of a dielectric material, such as a low-k dielectric material, an extra low-k (ELK) dielectric material, or the like. In some embodiments, the low-k dielectric material may include phosphosilicate glass (PSG), borophosphosilicate glass (BPSG), SiOC, Spin-On-Glass, compounds thereof, composites thereof, combinations thereof, or the like. In some embodiments, each dielectric layer of the interconnect structure 204 may be formed by suitable fabrication techniques, such as spin-on coating, CVD, PECVD, or the like. In some embodiments, the material of each conductive layer of the interconnect structure 204 may include aluminum, titanium, copper, nickel, tungsten, and/or alloys thereof. In some embodiments, each conductive layer of the interconnect structure 204 may be formed by electroplating, deposition, and/or photolithography and etching. The conductive layers of the interconnect structure 204 may include conductive lines, conductive pads, conductive vias, or the like. In some embodiments, the conductive layers of the interconnect structure 204 may include conductive lines and conductive vias interconnecting the layers of conductive lines.

Continue referring to FIG. 2A, a bonding layer 206A is formed over the interconnect structure 204. In some embodiments, the bonding layer 206A is deposited over the interconnect structure 204. The bonding layer 206A may facilitate the bonding process in the subsequent step (see FIG. 2C). In some embodiments, the bonding layer 206A may include an insulating material that is suitable for a subsequent dielectric-to-dielectric bonding process. Example materials for the bonding layer 206A include silicon oxide (e.g., $SiO_2$), silicon nitride, silicon oxynitride, silicon carbonitride, silicon oxycarbonitride, metal oxide, or the like. In certain embodiments, the metal oxide used for the bonding layer 206A includes titanium oxide, aluminum oxide, indium tin oxide or the like. In some alternatively embodiments, the bonding layer 206A may include a conductive material, such as metal. In certain embodiments, the metal used for the bonding layer 206A includes copper, aluminum, silver or the like. In some embodiments, the thickness of the bonding layer 206A is about 200 nm or less. For example, the thickness of the bonding layer 206A may range between about 5 nm to about 200 nm.

Figure 2B:
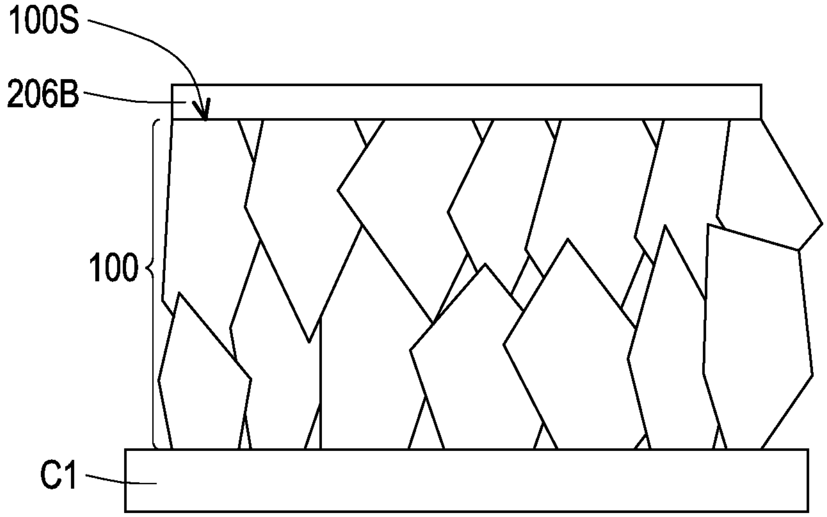

Referring to FIG. 2B, a bonding layer 206B is formed over the structure shown in FIG. 1C. In detail, as shown in FIG. 2B, the bonding layer 206B is formed over the surface 100S of the heat dissipation layer 100. In some embodiments, the bonding layer 206B is deposited over the heat dissipation layer 100. The bonding layer 206B may facilitate the bonding process in the subsequent step (see FIG. 2C). The bonding layer 206B may include an insulating material that is suitable for a subsequent dielectric-to-dielectric bonding process. Example materials for the bonding layer 206B include silicon oxide (e.g., $SiO_2$), silicon nitride, silicon oxynitride, silicon carbonitride, silicon oxycarbonitride, or the like. In certain embodiments, the metal oxide used for the bonding layer 206B includes titanium oxide, aluminum oxide, indium tin oxide or the like. In some alternatively embodiments, the bonding layer 206B may include a conductive material, such as metal. In certain embodiments, the metal used for the bonding layer 206A includes copper, aluminum, silver or the like. In some embodiments, the bonding layer 206B and the bonding layer 206A have the same material. In some alternative embodiments, the bonding layer 206B and the bonding layer 206A have different materials.

As mentioned above, the surface 100S of the heat dissipation layer 100 is substantially flat, and thus the bonding layer 206B is attached to a substantially flat surface. As such, it is noted that, the thickness of the bonding layer 206B can be well controlled to cover the morphology of the heat dissipation layer 100 without being too thick to sacrifice the benefit of thermal dissipation. In some embodiments, the thickness of the bonding layer 206B is about 200 nm or less. For example, the thickness of the bonding layer 206B may range between about 5 nm to about 200 nm.

Figure 2C:
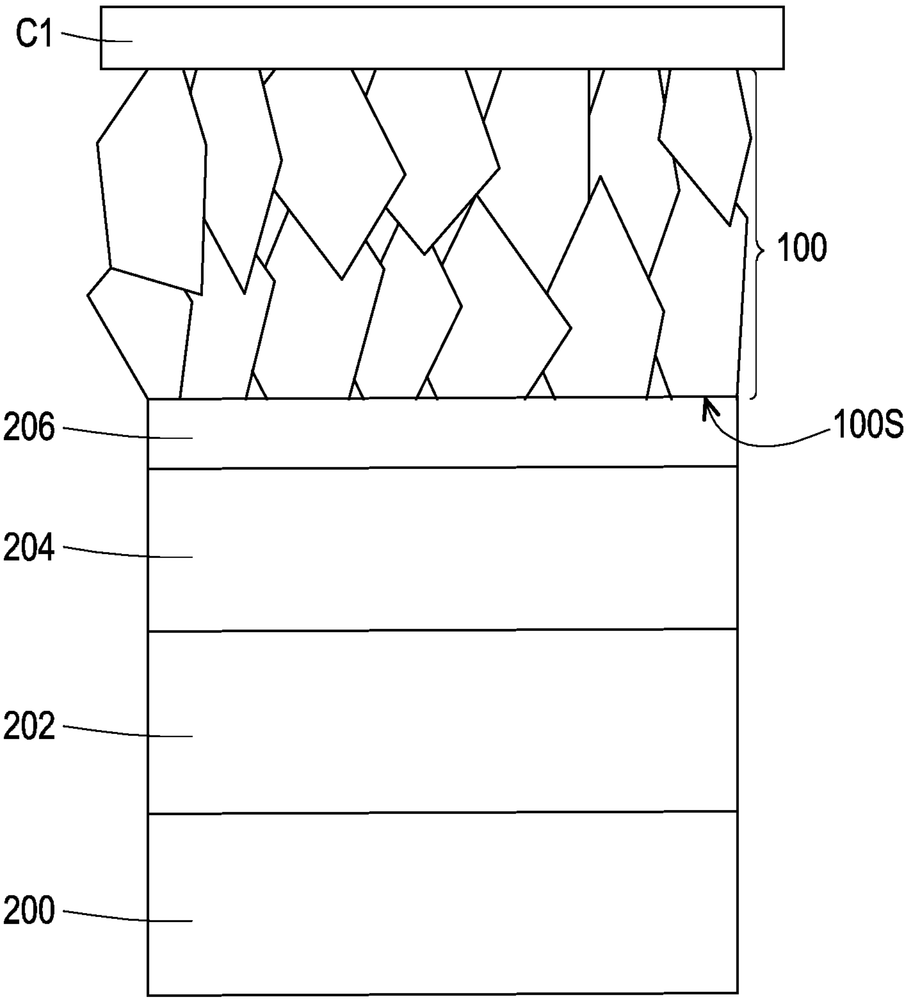

Referring to FIG. 2C, a bonding process is performed to bond the structure shown in FIG. 2B onto the interconnect structure 204 by the bonding layer 206A and the bonding layer 206B. After bonding process, the bonding layer 206A and the bonding layer 206B are collectively referred to as a bonding layer 206, as shown in FIG. 2C. It should be appreciated that the bonding layer 206 may include an internal interface where the bonding layer 206A and the bonding layer 206B meet.

Figure 2D:
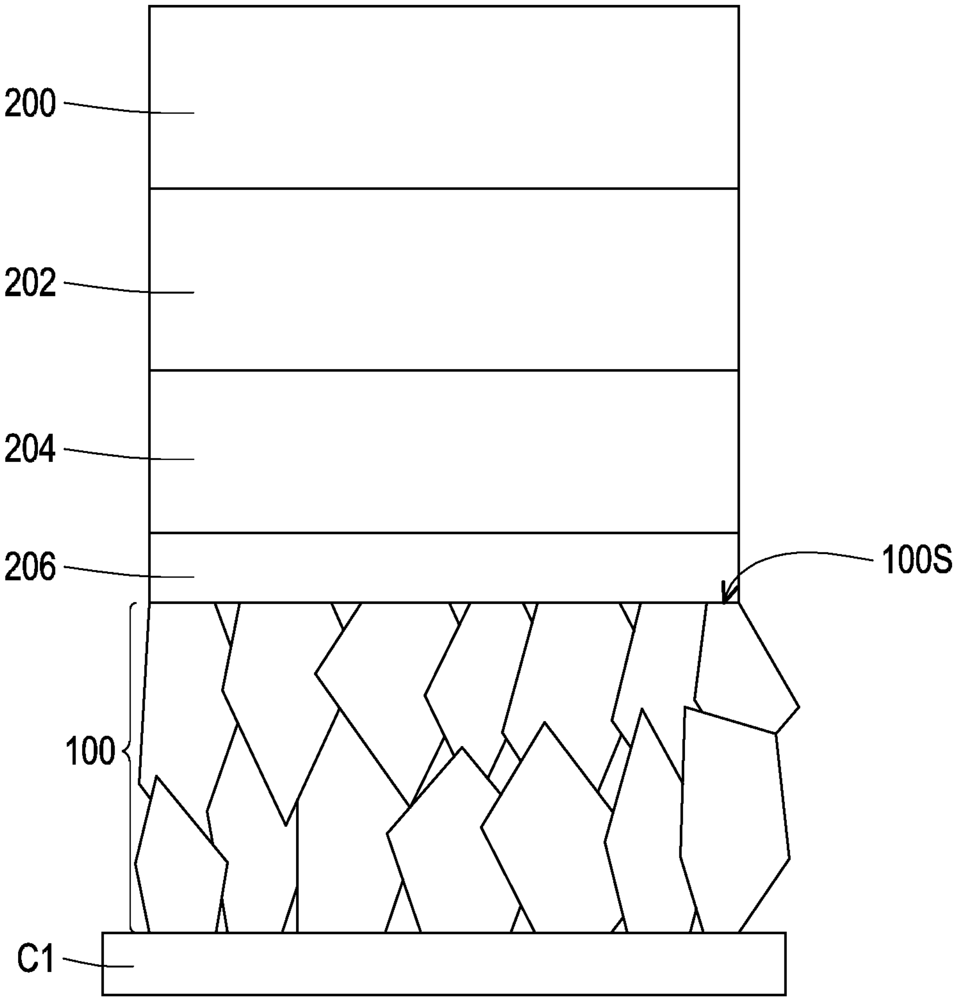

Referring to FIG. 2D, after the bonding process, the structure shown in FIG. 2C is flipped (i.e., turned upside down), such that a backside of the device layer 202 faces upwards. The backside of the device layer 202 may refer to a side opposite to the front-side of the device layer 202 on which the active components are formed. Further, it is noted that the carrier substrate C1 provides structural support during subsequent processing steps and in the completed semiconductor device 10.

Figure 2E:
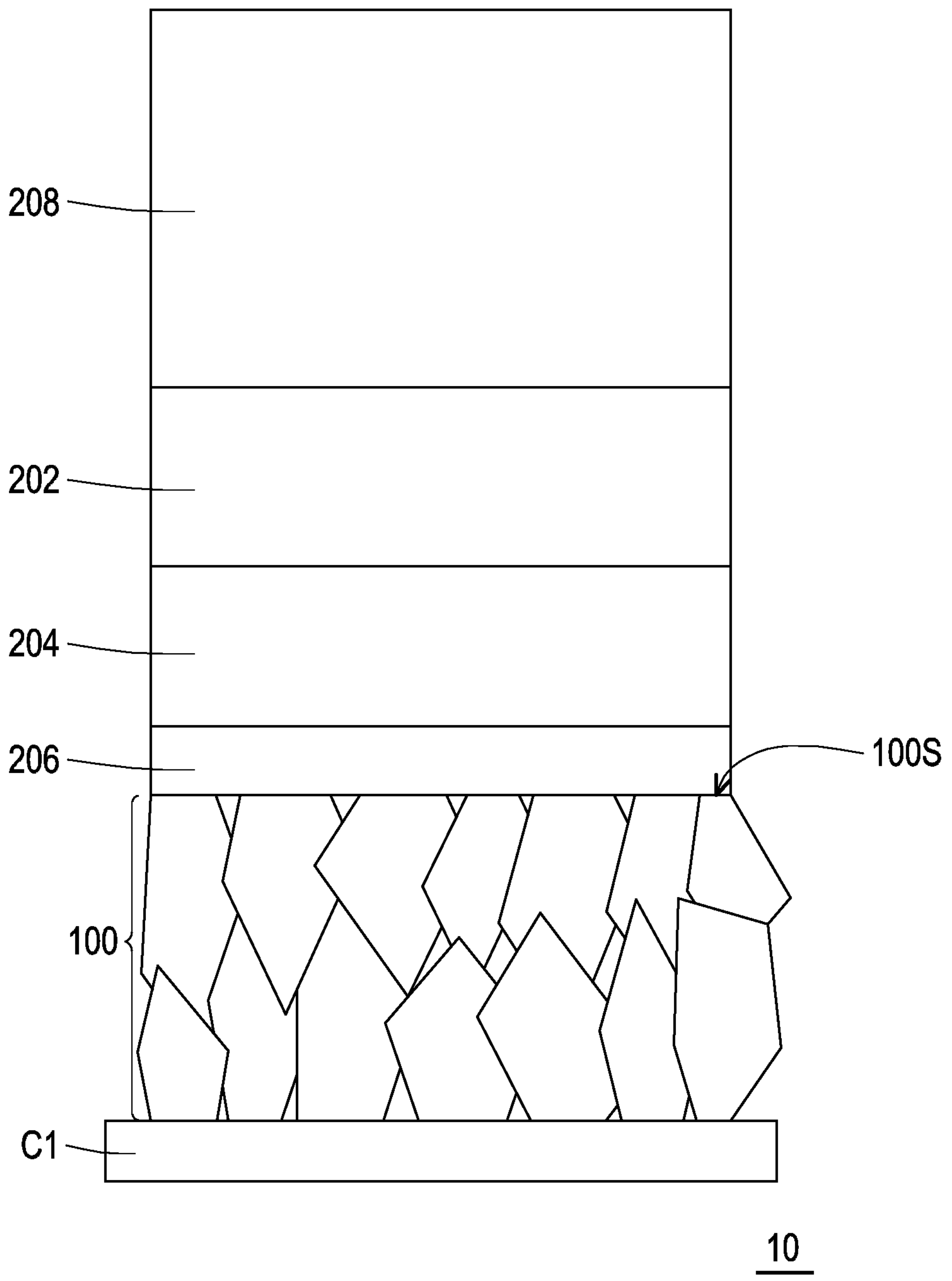

Referring to FIG. 2E, the substrate 200 (see FIG. 2D) is removed to expose the backside of the device layer 202. In some embodiments, the removal of the substrate 200 is performed by a mechanical grinding process, a CMP process, an etching process (e.g., dry etching process or wet etching process), or the like.

Subsequently, an interconnect structure 208 is formed over the exposed backside of the device layer 202, so that a semiconductor device 10 is completed. The interconnect structure 208 may be referred to as a backside interconnect structure because it is formed on the backside of the device layer 202. The interconnect structure 208 may include materials and be formed using processes the same as or similar to those used for the interconnect structure 204. In particular, in some embodiments, the interconnect structure 204 includes a plurality of dielectric layers and a plurality of conductive layers stacked alternately. In certain embodiments, the conductive layers are sandwiched between the dielectric layers, but the lowest layer of the conductive layers is exposed by the lowest layer of the dielectric layers for further electrical connection, and the topmost layer of the conductive layers is exposed by the topmost layer of the dielectric layers for further electrical connection. For example, the lowest layer of the conductive layers is exposed by the lowest layer of the dielectric layers to electrically connect the device layer 202, and the topmost layer of the conductive layers is exposed by the topmost layer of the dielectric layers to electrically connect external connectors.

As mentioned above, the heat dissipation layer 100 is made of the high kappa material having the kappa value equal to or larger than about 100 W/m·k. The thermal conductivity of a material is a measure of its ability to conduct heat, and it is commonly denoted by k-value or kappa value and is measured in W/m·K. It has been observed that when the heat dissipation layer 100 has the thermal conductivity in the above range, thermal dissipation in the completed semiconductor device 10 is sufficiently improved. In some embodiments, the heat dissipation layer 100 has the kappa value in a range of about 10 W/m·K to about 1500 W/m·K to achieve the above benefit, such as in a range of 50 W/m·K to 1500 W/m·K, 100 W/m·K to 1500 W/m·K, 300 W/m·K to 1500 W/m·K, 700 W/m·K to 1500 W/m·K, 1000 W/m·K to 1500 W/m·K, or the like.

Further, the heat dissipation layer 100 is interposed between the carrier substrate C1 and the interconnect structure 204, and thus the heat dissipation layer 100 may be also considered as a bonding layer between the carrier substrate C1 and the interconnect structure 204. As mentioned above, since the heat dissipation layer 100 can be formed with substantially flat surfaces without performing a planarization and the thickness of the bonding layer 206B can be well controlled to keep the benefit of thermal dissipation, by using the heat dissipation layer 100 as a part of the bonding layer in the bonding process, the completed semiconductor device 10 can have great heat dissipation without requiring performing a planarization to reduce the manufacturing challenges.

In the semiconductor device 10 illustrated in FIG. 2E, the carrier substrate C1 on which the heat dissipation layer 100 is formed is bonded to the interconnect structure 204 (i.e., the front-side interconnect structure). However, the disclosure is not limited thereto. In some alternative embodiments, the carrier substrate C1 on which the heat dissipation layer 100 is formed may be bonded to the backside interconnect structure. Hereinafter, other embodiment will be described in conjunction with FIG. 3A to FIG. 3D.

FIG. 3A to FIG. 3D are schematic cross-sectional views illustrating intermediate stages of a manufacturing process of a semiconductor device in accordance with some alternative embodiments of the disclosure. Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

Figure 3A:
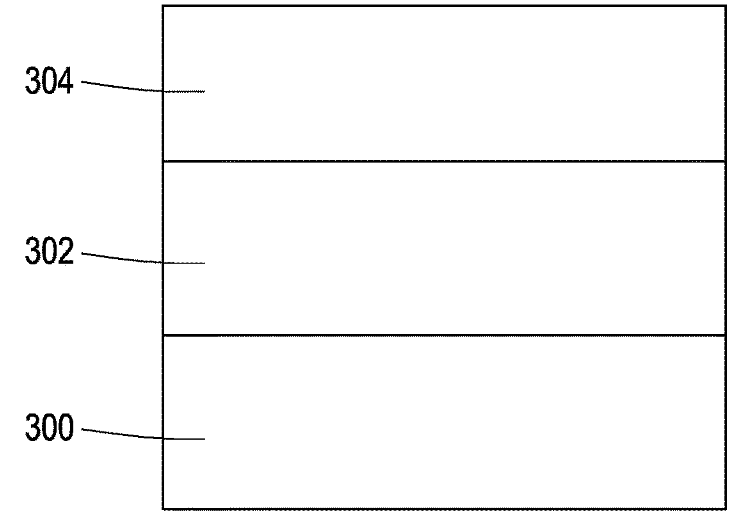
FIG. 3A to FIG. 3D are schematic cross-sectional views illustrating intermediate stages of a manufacturing process of a semiconductor device in accordance with some alternative embodiments of the disclosure.

Referring to FIG. 3A, a device layer 302 is formed over a substrate 300. The substrate 300 in FIG. 3A is similar to the substrate 200 in FIG. 2A, so the detailed description thereof is omitted herein. The device layer 302 in FIG. 3A is similar to the device layer 202 in FIG. 2A, so the detailed description thereof is omitted herein. Continue referring to FIG. 3A, an interconnect structure 304 is formed on the device layer 302. The interconnect structure 304 may be referred to as a front-side interconnect structure because it is formed on a front-side of the device layer 302 (e.g., a side of the device layer 202 on which active components are formed). The interconnect structure 304 in FIG. 3A is similar to the interconnect structure 204 in FIG. 2A, so other detailed description thereof is omitted herein.

Figure 3B:
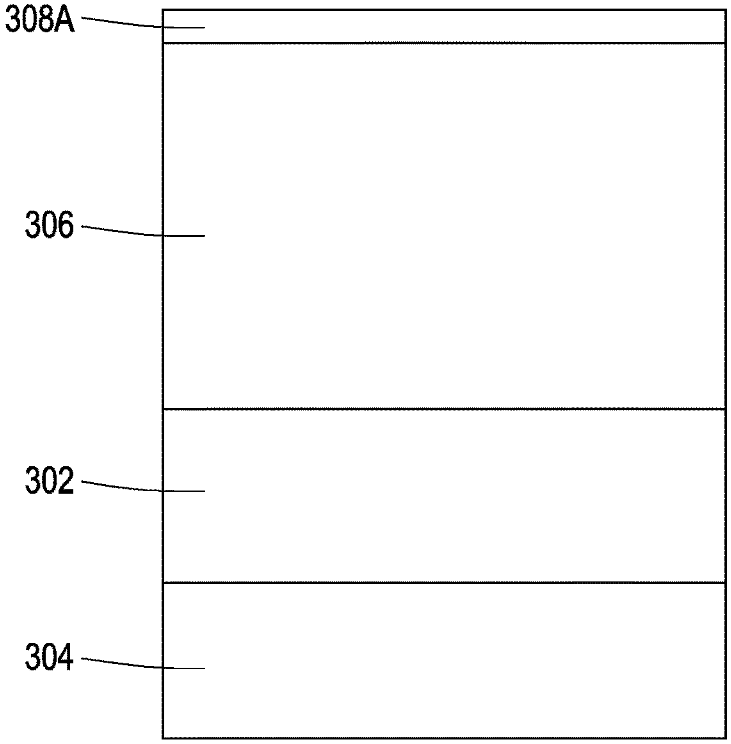

Referring to FIG. 3B, the structure shown in FIG. 3A is flipped (i.e., turned upside down), such that a backside of the device layer 302 faces upwards. The backside of the device layer 302 may refer to a side opposite to a front-side of the device layer 302 on which the active components are formed.

Subsequently, the substrate 300 (see FIG. 3A) is removed to expose the backside of the device layer 302. In some embodiments, the removal of the substrate 300 is performed by a mechanical grinding process, a CMP process, an etching process (e.g., dry etching process or wet etching process), or the like.

As shown in FIG. 3B, after the removal of the substrate 300, an interconnect structure 306 is formed over the exposed backside of the device layer 302. The interconnect structure 306 may be referred to as a backside interconnect structure because it is formed on the backside of the device layer 302. The interconnect structure 306 in FIG. 3B is similar to the interconnect structure 208 in FIG. 2E, so the detailed description thereof is omitted herein.

Subsequently, a bonding layer 308A is formed over the interconnect structure 306. In some embodiments, the bonding layer 308A is deposited over the interconnect structure 306. The bonding layer 308A may facilitate the bonding process in the subsequent step (see FIG. 3D). The bonding layer 308A in FIG. 3B is similar to the bonding layer 206A in FIG. 2A, so other detailed description thereof is omitted herein.

Figure 3C:
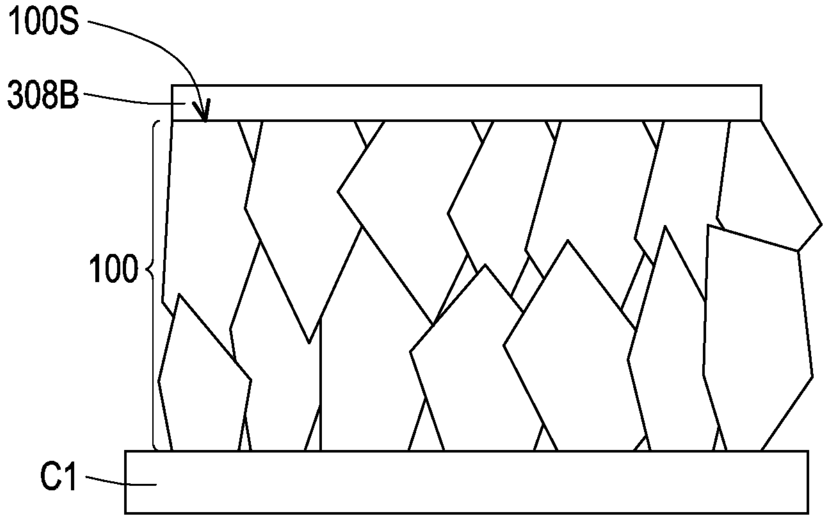

Referring to FIG. 3C, a bonding layer 308B is formed over the structure shown in FIG. 1C. In detail, as shown in FIG. 3C, the bonding layer 308B is formed over the surface 100S of the heat dissipation layer 100. In some embodiments, the bonding layer 308B is deposited over the heat dissipation layer 100. The bonding layer 308B may facilitate the bonding process in the subsequent step (see FIG. 3D).

As mentioned above, the surface 100S of the heat dissipation layer 100 is substantially flat, and thus the bonding layer 308B is attached to a substantially flat surface. As such, it is noted that, the thickness of the bonding layer 308B can be well controlled to cover the morphology of the heat dissipation layer 100 without being too thick to sacrifice the benefit of thermal dissipation. The bonding layer 308A in FIG. 3C is similar to the bonding layer 206B in FIG. 2B, so other detailed description thereof is omitted herein.

Figure 3D:
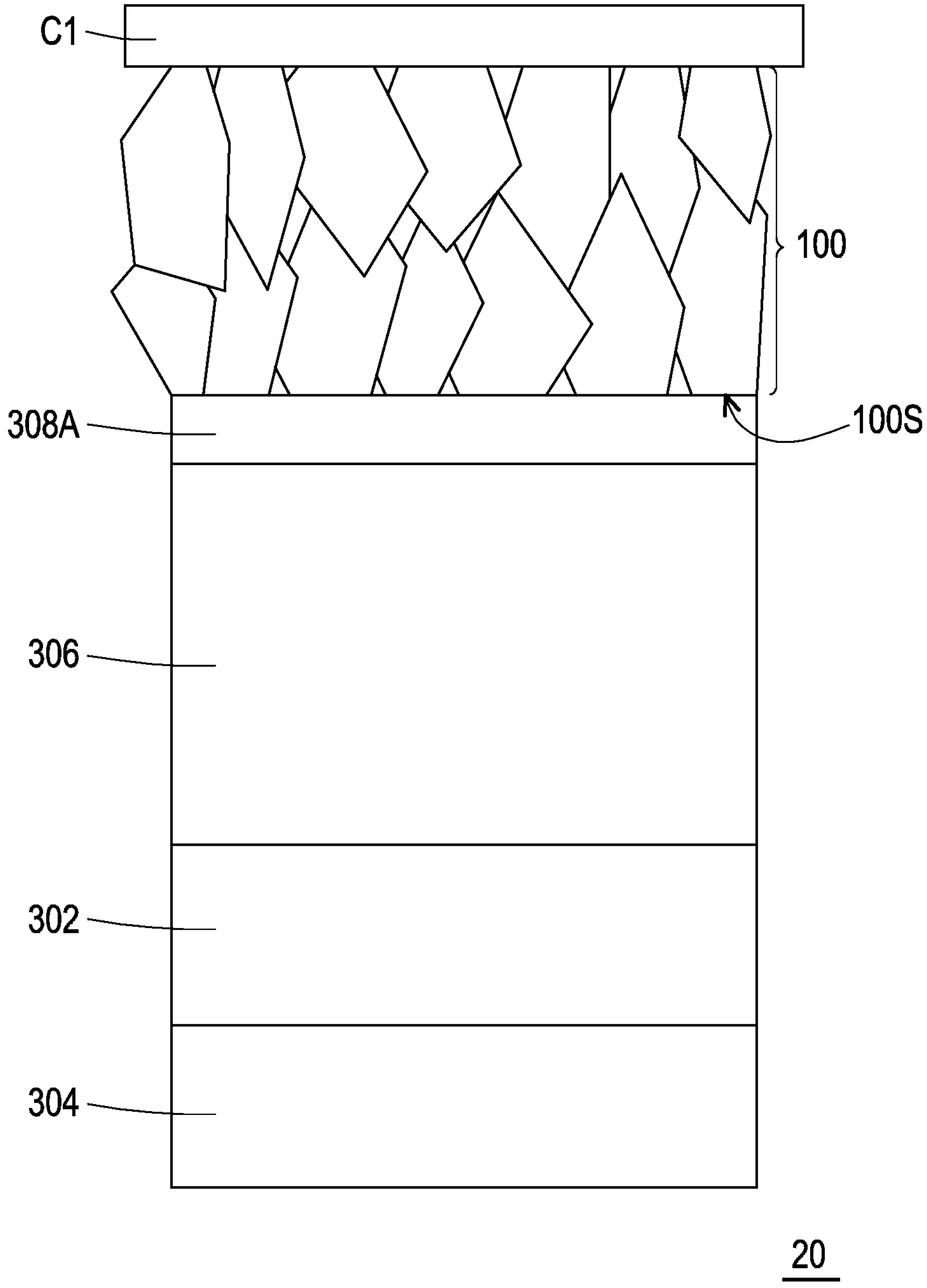

Referring to FIG. 3D, a bonding process is performed to bond the structure shown in FIG. 3C onto the interconnect structure 306 by the bonding layer 308A and the bonding layer 308B, so that a semiconductor device 20 is completed. After bonding process, the bonding layer 308A and the bonding layer 308B are collectively referred to as a bonding layer 308, as shown in FIG. 3D. The bonding layer 308 in FIG. 3D is similar to the bonding layer 206 in FIG. 2C, so the detailed description thereof is omitted herein.

As mentioned above, the heat dissipation layer 100 is made of the high kappa material having the kappa value equal to or larger than about 100 W/m·k. It has been observed that when the heat dissipation layer 100 has the thermal conductivity in the above range, thermal dissipation in the completed semiconductor device 20 is sufficiently improved.

As shown in FIG. 3D, the heat dissipation layer 100 is interposed between the carrier substrate C1 and the interconnect structure 306, and thus the heat dissipation layer 100 may be also considered as a bonding layer between the carrier substrate C1 and the interconnect structure 306. As mentioned above, since the heat dissipation layer 100 can be formed with substantially flat surfaces without performing a planarization and the thickness of the bonding layer 308B can be well controlled to keep the benefit of thermal dissipation, by using the heat dissipation layer 100 as a part of the bonding layer in the bonding process, the completed semiconductor device 20 can have great heat dissipation without requiring performing a planarization to reduce the manufacturing challenges.

In the semiconductor device 10 illustrated in FIG. 2E and the semiconductor device 20 illustrated in FIG. 3D, the heat dissipation layer 100 can be considered as a part of the bonding layer. However, the disclosure is not limited thereto. In some alternative embodiments, the heat dissipation layer 100 may be considered as a heat sink. Hereinafter, other embodiment will be described in conjunction with FIG. 4A to FIG. 4D.

FIG. 4A to FIG. 4D are schematic cross-sectional views illustrating intermediate stages of a manufacturing process of a semiconductor device in accordance with some alternative embodiments of the disclosure. Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

Figure 4A:
FIG. 4A to FIG. 4D are schematic cross-sectional views illustrating intermediate stages of a manufacturing process of a semiconductor device in accordance with some alternative embodiments of the disclosure.

Referring to FIG. 4A, a device layer 402 is formed over a substrate 400. The substrate 400 in FIG. 4A is similar to the substrate 200 in FIG. 2A, so the detailed description thereof is omitted herein. The device layer 402 in FIG. 4A is similar to the device layer 202 in FIG. 2A, so the detailed description thereof is omitted herein. Continue referring to FIG. 4A, an interconnect structure 404 is formed on the device layer 402. The interconnect structure 404 may be referred to as a front-side interconnect structure because it is formed on a front-side of the device layer 402 (e.g., a side of the device layer 402 on which active components are formed). The interconnect structure 404 in FIG. 4A is similar to the interconnect structure 204 in FIG. 2A, so other detailed description thereof is omitted herein. Continue referring to FIG. 4A, a bonding layer 406 is formed over the interconnect structure 404. In some embodiments, the bonding layer 406 is deposited over the interconnect structure 404. The bonding layer 406 may facilitate the bonding process in the subsequent step (see FIG. 4B). The bonding layer 406 in FIG. 4A is similar to the bonding layer 206A in FIG. 2A, so other detailed description thereof is omitted herein.

Figure 4B:
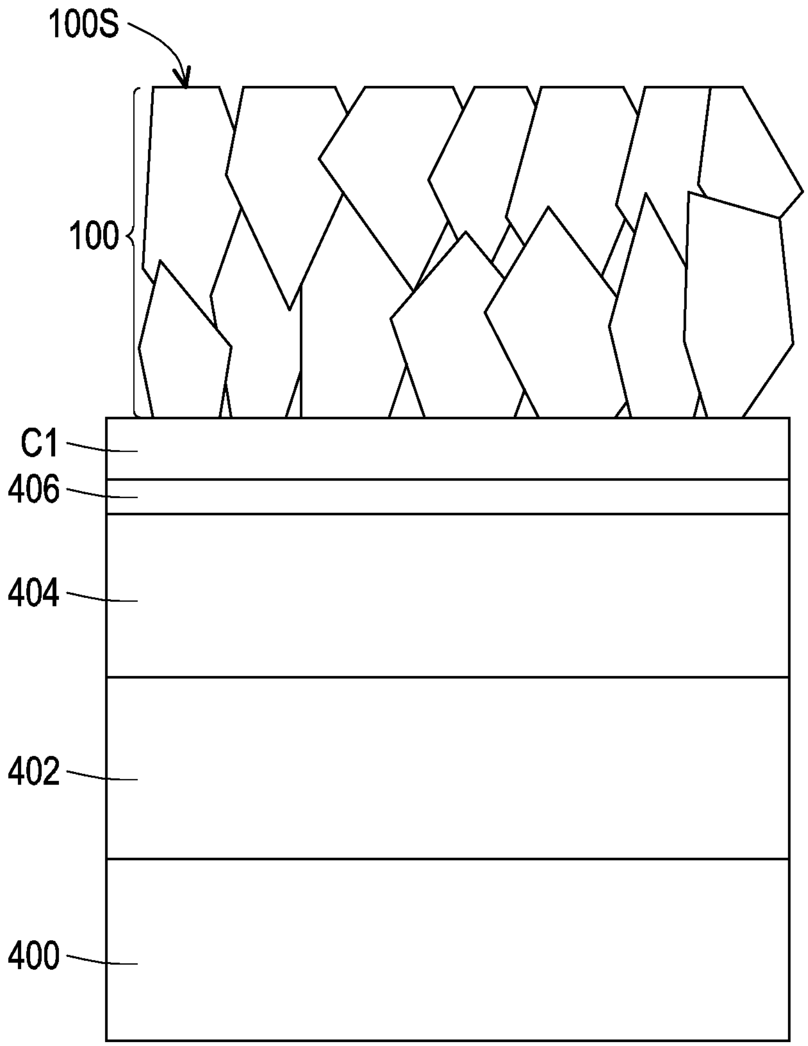

Referring to FIG. 4B, a bonding process is performed to bond the structure shown in FIG. 1C onto the interconnect structure 404 by the bonding layer 406. In detail, as shown in FIG. 4B, the carrier substrate C1 is attached to the bonding layer 406. That is, the carrier substrate C1 is interposed between the bonding layer 406 and the heat dissipation layer 100, and the surface 100S of the heat dissipation layer 100 is exposed without being covered by any other layer.

Figure 4C:
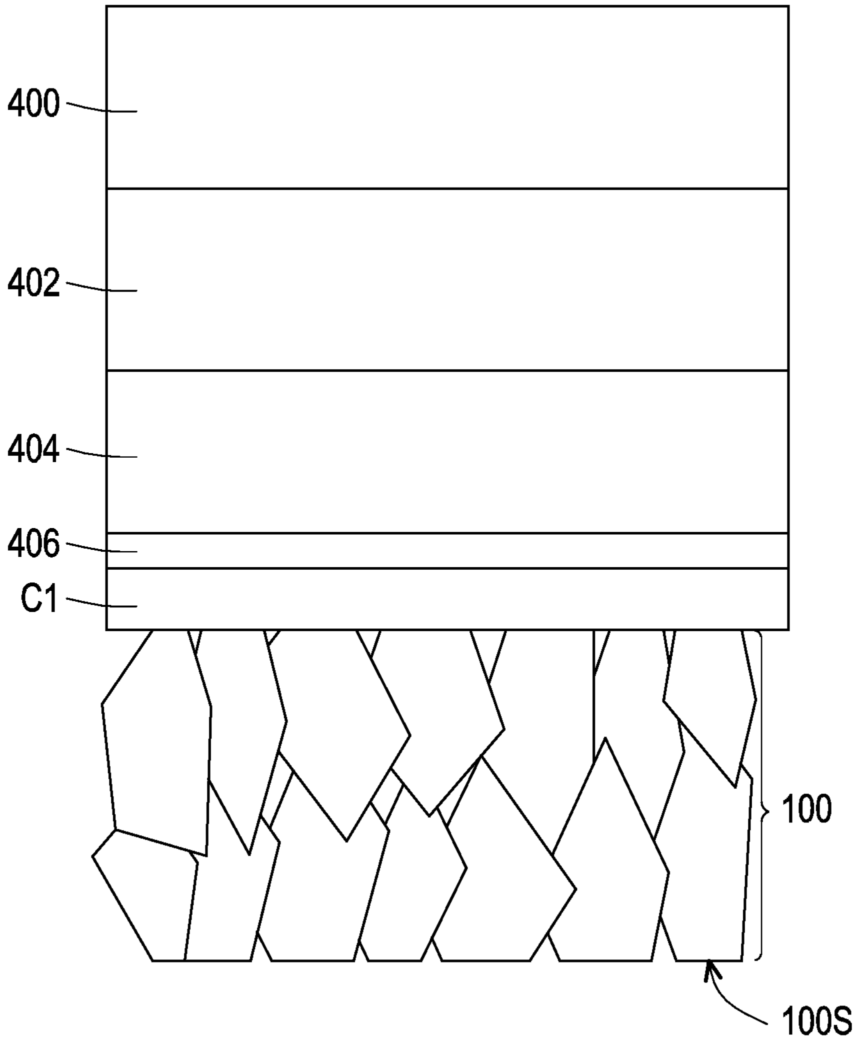

Referring to FIG. 4C, after the bonding process, the structure shown in FIG. 4B is flipped (i.e., turned upside down), such that a backside of the device layer 402 faces upwards. The backside of the device layer 402 may refer to a side opposite to the front-side of the device layer 402 on which the active components are formed. Further, it is noted that the carrier substrate C1 provides structural support during subsequent processing steps and in the completed semiconductor device 30.

Figure 4D:
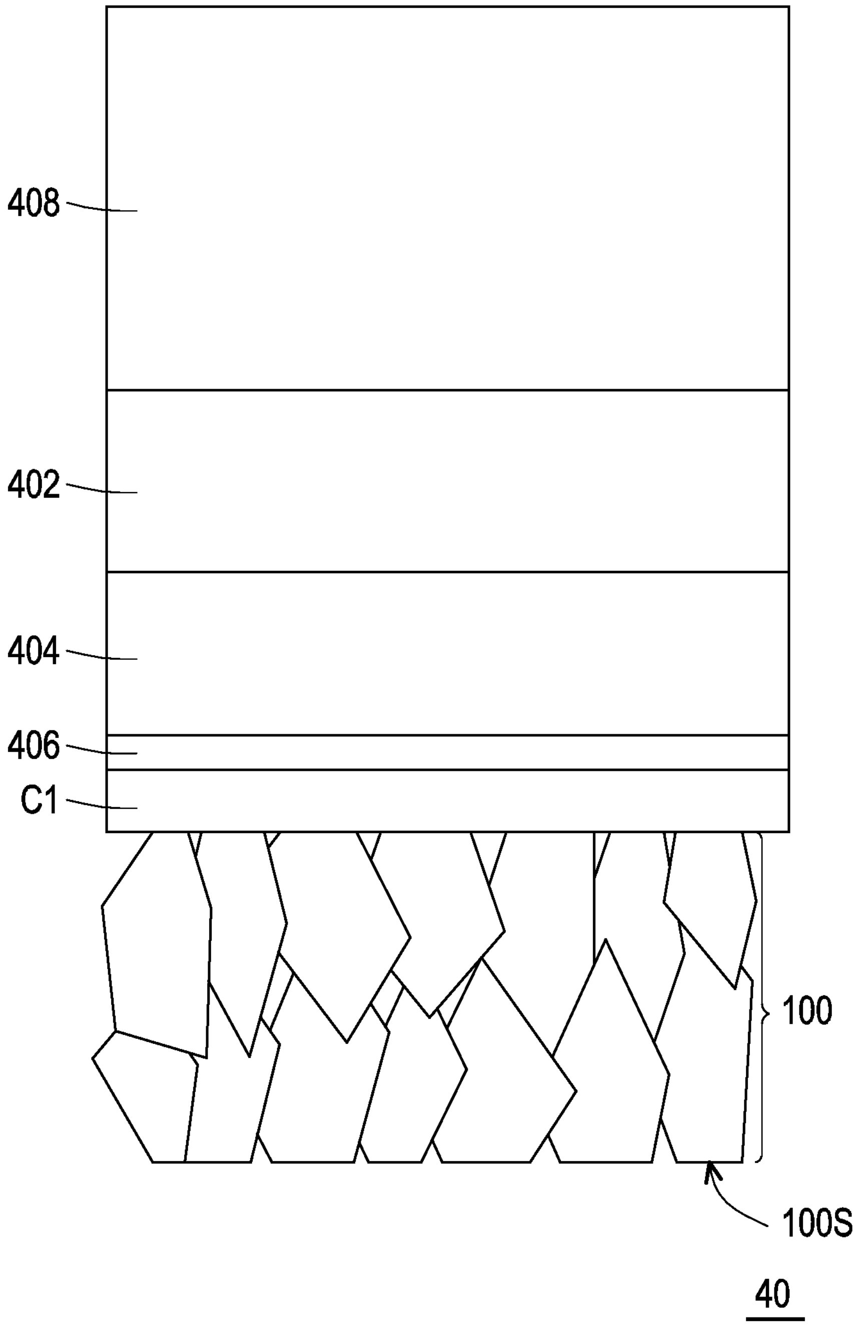

Referring to FIG. 4D, the substrate 400 (see FIG. 4C) is removed to expose the backside of the device layer 402. In some embodiments, the removal of the substrate 400 is performed by a mechanical grinding process, a CMP process, an etching process (e.g., dry etching process or wet etching process), or the like.

Subsequently, an interconnect structure 408 is formed over the exposed backside of the device layer 402, so that a semiconductor device 30 is completed. The interconnect structure 408 may be referred to as a backside interconnect structure because it is formed on the backside of the device layer 402. The interconnect structure 408 in FIG. 4D is similar to the interconnect structure 208 in FIG. 2E, so the detailed description thereof is omitted herein.

As mentioned above, the heat dissipation layer 100 is made of the high kappa material having the kappa value equal to or larger than about 100 W/m·k. It has been observed that when the heat dissipation layer 100 has the thermal conductivity in the above range, thermal dissipation in the completed semiconductor device 30 is sufficiently improved. Further, since the heat dissipation layer 100 is disposed on the most outside of the semiconductor device 30, the heat dissipation layer 100 may be considered as a heat sink. In addition, as mentioned above, since the heat dissipation layer 100 can be formed with substantially flat surfaces without performing a planarization, by using the heat dissipation layer 100 as the heat sink, the completed semiconductor device 30 can have great heat dissipation without requiring performing a planarization to reduce the manufacturing challenges.

During the manufacturing process of the heat dissipation layer 100 illustrated in FIG. 1A to FIG. 1C, one heat dissipation layer 100 is formed. However, the disclosure is not limited thereto. In some alternative embodiments, during a single manufacturing process, more than one of the heat dissipation layer may be formed. Hereinafter, other embodiment will be described in conjunction with FIG. 5A to FIG. 5E.

FIG. 5A to FIG. 5E are schematic cross-sectional views illustrating a manufacturing process of a heat dissipation layer in accordance with some alternative embodiments of the disclosure. Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

Figure 5A:
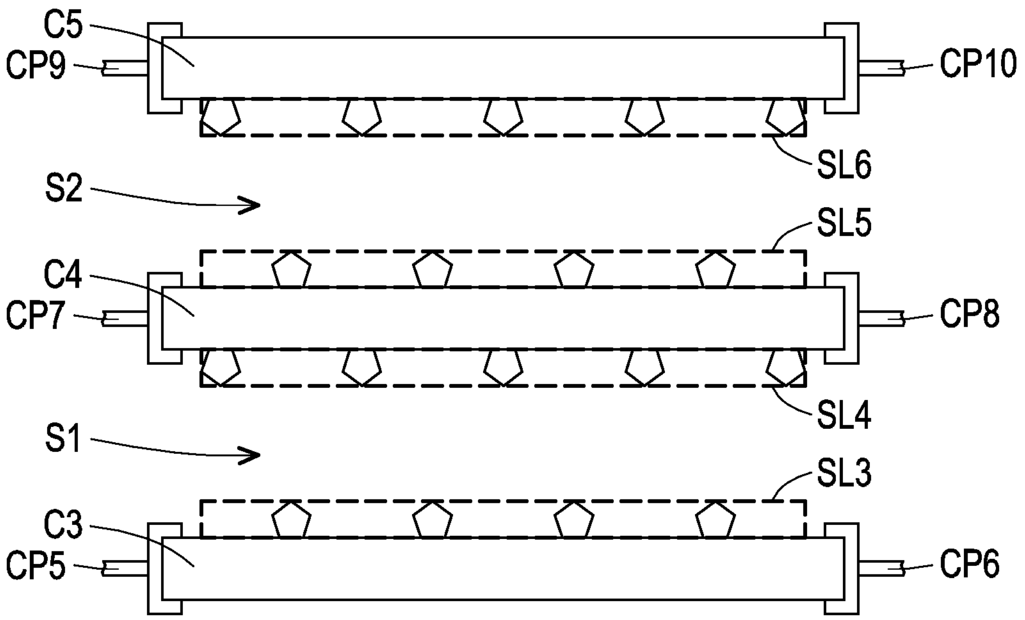
FIG. 5A to FIG. 5E are schematic cross-sectional views illustrating a manufacturing process of a heat dissipation layer in accordance with some alternative embodiments of the disclosure.

Referring to FIG. 5A, three carrier substrates C3, C4 and C5 are provided, wherein the carrier substrates C3 and C4 create a confined space S1, and the carrier substrates C4 and C5 create a confined space S2. The carrier substrate C3 is secured in clamps CP5 and CP6, the carrier substrate C4 is secured in clamps CP7 and CP8 and the carrier substrate C5 is secured in clamps CP9 and CP10, so that the confined space S1 are formed between the carrier substrates C3 and C4, and the confined space S2 are formed between the carrier substrates C4 and C5. In detail, as shown in FIG. 5A, the clamps CP5 and CP6 attach to side walls of the carrier substrate C3, the clamps CP7 and CP8 attach to side walls of the carrier substrate C4, and the clamps CP9 and CP10 attach to side walls of the carrier substrate C5. Each of the carrier substrates C3, C4 and C5 in FIG. 5A is similar to the carrier substrate C1 or the carrier substrate C2 in FIG. 1A, so other detailed description thereof is omitted herein.

Continue referring to FIG. 5A, a seed layer SL3 is formed on the carrier substrate C3, a seed layer SL4 and a seed layer SL5 are formed on the carrier substrate C4, and a seed layer SL6 is formed on the carrier substrate C5. In detail, the seed layer SL3 is formed on a surface of the carrier substrate C3 facing toward the carrier substrate C4, the seed layer SL4 is formed on a surface of the carrier substrate C4 facing toward the carrier substrate C3, the seed layer SL5 is formed on a surface of the carrier substrate C4 facing toward the carrier substrate C5, and the seed layer SL6 is formed on a surface of the carrier substrate C5 facing toward the carrier substrate C4. Each of the seed layers SL3, SL4, SL5 and SL6 in FIG. 5A is similar to the seed layer SL1 or the seed layer SL2 in FIG. 1A, so other detailed description thereof is omitted herein.

Figure 5B:
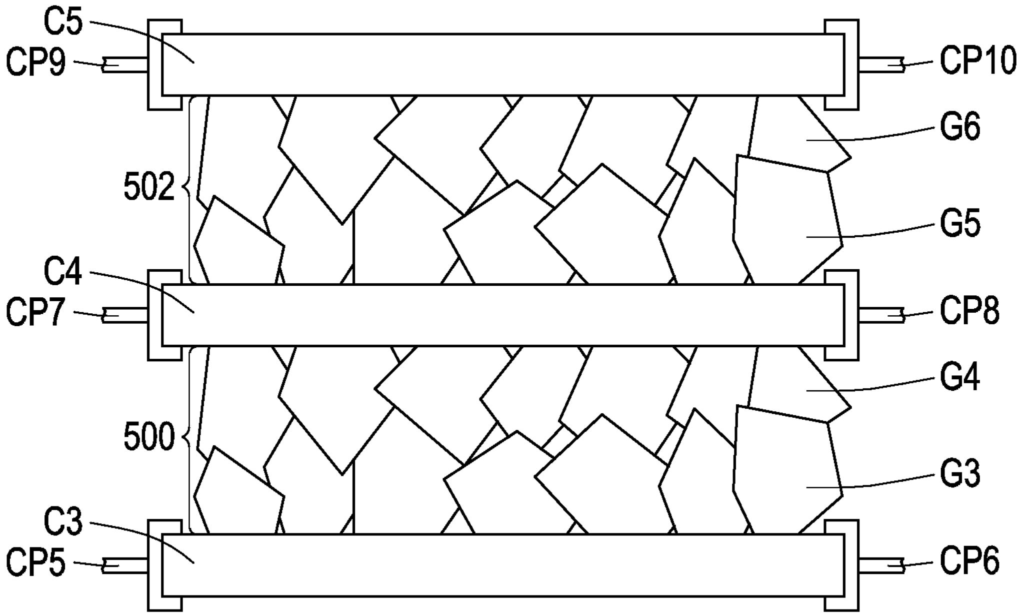

Referring to FIG. 5B, a heat dissipation layer 500 is formed in the confined space S1 between the carrier substrates C3 and C4, and a heat dissipation layer 502 is formed in the confined space S2 between the carrier substrates C4 and C5. In detail, as shown in FIG. 5A and FIG. 5B, the heat dissipation layer 500 is grown from the seed layers SL3 and SL4, and the heat dissipation layer 502 is grown from the seed layers SL5 and SL6. As such, the heat dissipation layer 500 inherent the same materials as the seed layers SL3 and SL4, and the heat dissipation layer 502 inherent the same materials as the seed layers SL5 and SL6.

In some embodiments, each of the heat dissipation layers 500 and 502 is formed as a crystalline material layer having crystals (grains). In one embodiment, each of the heat dissipation layers 500 and 502 is formed as a polycrystalline material layer with nano-sized grains (nano grains). As shown in FIG. 5B, the heat dissipation layer 500 is a grained material layer formed with grains G3 grown from the seed layer SL3 and grains G4 grown from the seed layer SL4, and the heat dissipation layer 502 is a grained material layer formed with grains G5 grown from the seed layer SL5 and grains G6 grown from the seed layer SL6. From another point of view, since each of the heat dissipation layers 500 and 502 is grown from two seed layers (e.g., the two seed layers SL3 and SL4, or the two seed layers SL5 and SL6) spaced from each other, there are voids in each of the heat dissipation layers 500 and 502. As shown in FIG. 5B, the voids are formed between the grains G3 and G4, and between the grains G5 and G6. Even there are voids in each of the heat dissipation layers 500 and 502, by selecting the high kappa material having the kappa value equal to or larger than about 100 W/m·k as the material of each of the heat dissipation layers 500 and 502, each of the heat dissipation layers 500 and 502 still functions great heat dissipation. Each of the heat dissipation layers 500 and 502 in FIG. 5B is similar to the heat dissipation layer 100 in FIG. 1B, so other detailed description thereof is omitted herein.

Figure 5C:
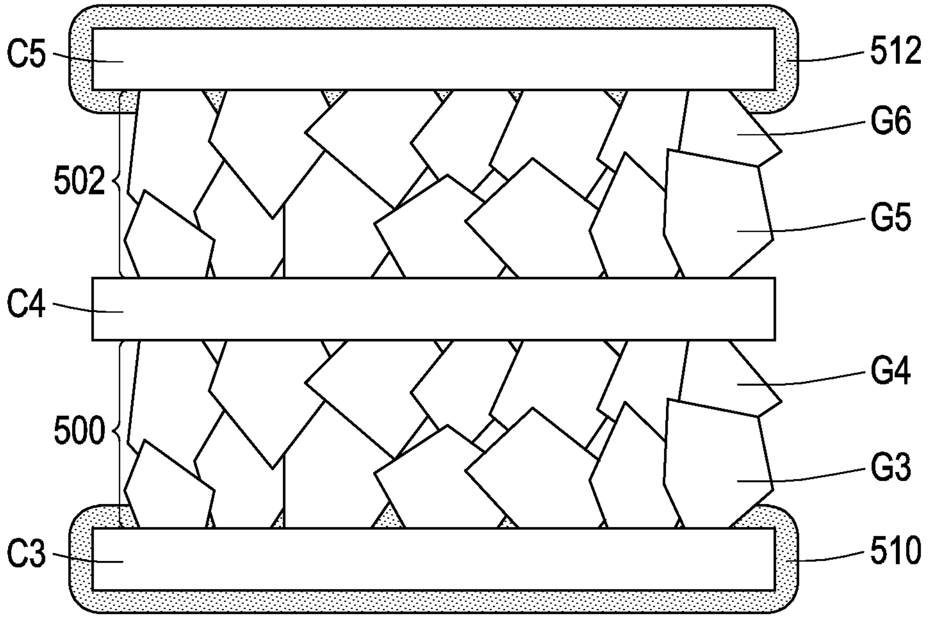

Referring to FIG. 5C, a protection layer 510 is formed to cover the carrier substrate C3, and a protection layer 512 is formed to cover the carrier substrate C5. In detail, surfaces of the carrier substrate C3 that do not be covered by the heat dissipation layer 500 are covered by the protection layer 510, and surfaces of the carrier substrate C4 that do not be covered by the heat dissipation layer 502 are covered by the protection layer 512. In some embodiments, as shown in FIG. 5C, the protection layer 510 covering the carrier substrate C3 is in contact with the heat dissipation layer 500, and the protection layer 512 covering the carrier substrate C5 is in contact with the heat dissipation layer 502. However, the disclosure is not limited thereto. In some alternative embodiments, the protection layer 510 may cover the carrier substrate C3 without being in contact with the heat dissipation layer 500, and the protection layer 512 may cover the carrier substrate C4 without being in contact with the heat dissipation layer 500.

In some embodiments, the material of each of the protection layers 510 and 512 may include dielectrics, metals, organic films or the like. In some embodiments, each of the protection layers 510 and 512 may be formed by suitable fabrication techniques, such as CVD, PVD, coating, or the like.

Figure 5D:
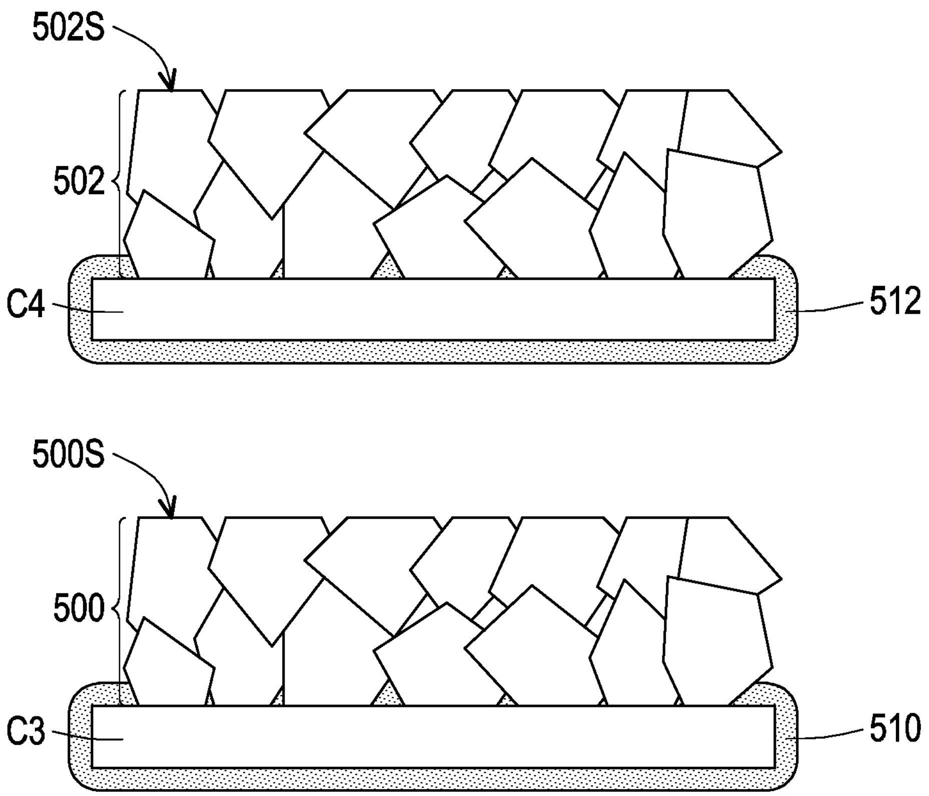

Referring to FIG. 5D, after the formation of the protection layers 510 and 512, the carrier substrate C4 is removed, so that the heat dissipation layer 500 and the heat dissipation layer 502 are separated. That is, after the carrier substrate C4 is removed, two individual heat dissipation layers (i.e., the heat dissipation layer 500 and the heat dissipation layer 502) are obtained. In some embodiments, the removal of the carrier substrate C4 is performed by an etching process. In certain embodiments, the carrier substrate C4 is removed by a wet etching process. From another point of view, after the carrier substrate C4 is removed, the carrier substrate C3 and the carrier substrate C5 remain. That is, the protection layer 510 and the protection layer 512 respectively protect the carrier substrate C3 and the carrier substrate C5 from being damage and/or removed during the removal of the carrier substrate C4.

Continue referring to FIG. 5D, after the carrier substrate C4 is removed, a surface 500S of the heat dissipation layer 500 and a surface 502S of the heat dissipation layer 502 are exposed. Since the heat dissipation layer 500 is grown from the seed layers SL3 and SL4 respectively formed on the surfaces of the two carrier substrates C3 and C4, the exposed surface 500S is substantially flat. Similarly, since the heat dissipation layer 502 is grown from the seed layers SL5 and SL6 respectively formed on the surfaces of the two carrier substrates C4 and C5, the exposed surface 502S is substantially flat. In some embodiments, the surface roughness of each of the surfaces 500S and 502S is less than about 1 nm. As such, each of the heat dissipation layers 500 and 502 provides a substantially flat surface for a layer attached onto each of the heat dissipation layers 500 and 502 formed in the subsequent step. It is noted that, by growing the heat dissipation layers 500 and 502 made of the high kappa material respectively in the confined space S1 and the confined space S2, each of the heat dissipation layers 500 and 502 can be formed with substantially flat surfaces without performing a planarization on the high kappa material (which leads to extreme challenges). As such, the manufacturing challenges of the manufacturing process of each of the heat dissipation layers 500 and 502 can be reduced. From another point of view, after the carrier substrate C4 is removed, the grain boundaries and the voids of each of the heat dissipation layers 500 and 502 are also exposed.

Figure 5E:
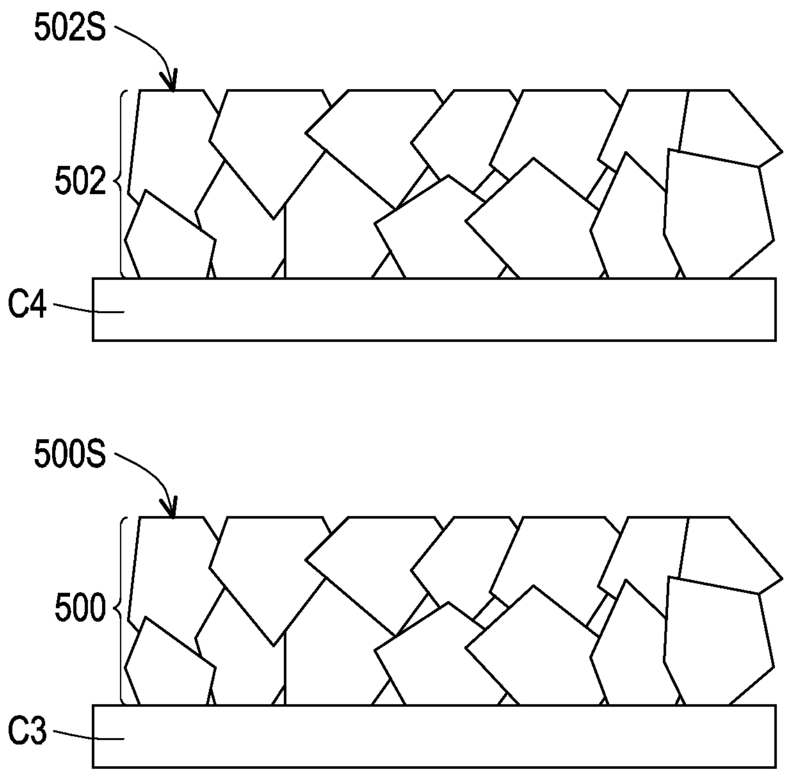

Referring to FIG. 5E, after the removal of the carrier substrate C4, the protection layers 510 and 512 are removed. In some embodiments, the removal of the protection layers 510 and 512 is performed by etch, or ashing.

In accordance with an embodiment, a manufacturing method of a heat dissipation layer includes: providing a first carrier substrate and a second carrier substrate creating a first confined space therebetween; forming a first seed layer on the first carrier substrate and a second seed layer on the second carrier substrate; forming a first heat dissipation layer from the first seed layer and the second seed layer in the first confined space; and removing the second carrier substrate from the first heat dissipation layer.

In accordance with an embodiment, manufacturing method of a semiconductor device includes: sequentially forming a device layer, a first interconnect structure and a first bonding layer over a substrate; forming a heat dissipation layer on a first carrier substrate, comprising: providing the first carrier substrate and a second carrier substrate stacking over the first carrier substrate, wherein a confined space is between the first carrier substrate and the second carrier substrate; forming a first seed layer on the first carrier substrate and a second seed layer on the second carrier substrate; growing the heat dissipation layer from the first seed layer and the second seed layer in the confined space; and removing the second carrier substrate to expose a surface of the heat dissipation layer; bonding the heat dissipation layer onto the first interconnect structure by the first bonding layer; removing the substrate to expose the device layer; and forming a second interconnect structure on the device layer.

In accordance with an embodiment, a manufacturing method of a semiconductor device includes: sequentially forming a device layer and a first interconnect structure over a substrate; removing the substrate to expose the device layer; sequentially forming a second interconnect structure and a first bonding layer on the device layer; providing a heat dissipation layer formed on a first carrier substrate, comprising: providing the first carrier substrate and a second carrier substrate stacking over the first carrier substrate, wherein the first carrier substrate and the second carrier substrate are spaced apart from each other along a stacking direction; forming a first seed layer on the first carrier substrate and a second seed layer on the second carrier substrate; growing the heat dissipation layer from the first seed layer and the second seed layer between the first carrier substrate and the second carrier substrate; and removing the second carrier substrate to expose a surface of the heat dissipation layer; forming a second bonding layer on the exposed surface of the heat dissipation layer; and bonding the heat dissipation layer onto the second interconnect structure by the first bonding layer and the second bonding layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a heat dissipation layer, comprising:

providing a first carrier substrate and a second carrier substrate creating a first confined space therebetween;

forming a first seed layer on the first carrier substrate and a second seed layer on the second carrier substrate;

forming a first heat dissipation layer from the first seed layer and the second seed layer in the first confined space, wherein the first heat dissipation layer is formed with first grains grown from the first seed layer and second grains grown from the second seed layer; and removing the second carrier substrate from the first heat dissipation layer.

2. The manufacturing method of claim 1, wherein the first seed layer is formed on a surface of the first carrier substrate facing toward the second carrier substrate, and the second seed layer is formed on a surface of the second carrier substrate facing toward the first carrier substrate.

3. The manufacturing method of claim 1, wherein a material of the first heat dissipation layer includes a high kappa material.

4. The manufacturing method of claim 1, wherein after the second carrier substrate is removed, a surface of the first heat dissipation layer with a surface roughness of less than about 1 nm is exposed.

5. The manufacturing method of claim 1, wherein the second carrier substrate is removed by a mechanical grinding process, a chemical mechanical polishing (CMP) process, or an etching process.

6. The manufacturing method of claim 1, further comprising:

providing a third carrier substrate over the second carrier substrate, wherein the third carrier substrate and the second carrier substrate creates a second confined space therebetween;

forming a third seed layer on the second carrier substrate and a fourth seed layer on the third carrier substrate;

forming a second heat dissipation layer from the third seed layer and the fourth seed layer in the second confined space; and forming a first protection layer covering the first carrier substrate and a second protection layer covering the third carrier substrate.

7. The manufacturing method of claim 6, wherein the third seed layer is formed on a surface of the second carrier substrate facing toward the third carrier substrate, and the fourth seed layer is formed on a surface of the third carrier substrate facing toward the second carrier substrate.

8. The manufacturing method of claim 6, wherein the second heat dissipation layer is formed with third grains grown from the third seed layer and fourth grains grown from the fourth seed layer.

9. The manufacturing method of claim 6, wherein after the second carrier substrate is removed, a surface of the second heat dissipation layer with a surface roughness of less than about 1 nm is exposed and the first carrier substrate covering by the first protection layer and the third carrier substrate covering by the second protection layer remain, wherein the second carrier substrate is removed by an etching process.

10. The manufacturing method of claim 1, wherein a thickness of the first heat dissipation layer ranges from about 1 μm to about 5 μm.

11. A manufacturing method of a semiconductor device, comprising:

sequentially forming a device layer, a first interconnect structure and a first bonding layer over a substrate;

forming a heat dissipation layer on a first carrier substrate, comprising:

providing the first carrier substrate and a second carrier substrate stacking over the first carrier substrate, wherein a confined space is between the first carrier substrate and the second carrier substrate;

forming a first seed layer on the first carrier substrate and a second seed layer on the second carrier substrate;

growing the heat dissipation layer from the first seed layer and the second seed layer in the confined space; and removing the second carrier substrate to expose a surface of the heat dissipation layer;

bonding the heat dissipation layer onto the first interconnect structure by the first bonding layer;

removing the substrate to expose the device layer; and forming a second interconnect structure on the device layer.

12. The manufacturing method of claim 11, wherein a material of the heat dissipation layer includes a high kappa material.

13. The manufacturing method of claim 11, further comprising forming a second bonding layer on the exposed surface of the heat dissipation layer, wherein the heat dissipation layer is bonded onto the first interconnect structure by the first bonding layer and the second bonding layer.

14. The manufacturing method of claim 11, wherein the first carrier substrate is in contact with the first bonding layer when the heat dissipation layer is bonded onto the first interconnect structure.

15. The manufacturing method of claim 11, wherein a surface roughness of the exposed surface of the heat dissipation layer is less than about 1 nm.

16. A manufacturing method of a semiconductor device, comprising:

sequentially forming a device layer and a first interconnect structure over a substrate;

removing the substrate to expose the device layer;

sequentially forming a second interconnect structure and a first bonding layer on the device layer;

providing a heat dissipation layer formed on a first carrier substrate, comprising:

providing the first carrier substrate and a second carrier substrate stacking over the first carrier substrate, wherein the first carrier substrate and the second carrier substrate are spaced apart from each other along a stacking direction;

forming a first seed layer on the first carrier substrate and a second seed layer on the second carrier substrate;

growing the heat dissipation layer from the first seed layer and the second seed layer between the first carrier substrate and the second carrier substrate; and removing the second carrier substrate to expose a surface of the heat dissipation layer;

forming a second bonding layer on the exposed surface of the heat dissipation layer; and bonding the heat dissipation layer onto the second interconnect structure by the first bonding layer and the second bonding layer.

17. The manufacturing method of claim 16, wherein a material of the heat dissipation layer includes a high kappa material.

18. The manufacturing method of claim 16, wherein a thickness of the heat dissipation layer ranges from about 1 μm to about 5 μm.

19. The manufacturing method of claim 16, wherein a thickness of the second bonding layer ranges from about 5 nm to about 200 nm.

20. The manufacturing method of claim 11, wherein a surface roughness of the exposed surface of the heat dissipation layer is less than about 1 nm.

* * * * *